United States Patent

Minami et al.

[11] Patent Number: 5,960,286
[45] Date of Patent: Sep. 28, 1999

[54] METHOD OF MANUFACTURING POWER SEMICONDUCTOR DEVICES

[75] Inventors: Yoshihiro Minami, Tokyo; Shigeru Hasegawa, Yokohama; Hiroshi Takenaka, Kawasaki; Tsuneo Ogura, Yokohama; Shinji Sato, Tokyo, all of Japan

[73] Assignee: Kabushiki Kaisha Toshiba, Kawasaki, Japan

[21] Appl. No.: 08/848,187

[22] Filed: Apr. 29, 1997

Related U.S. Application Data

[63] Continuation-in-part of application No. 08/392,320, Feb. 22, 1995, abandoned.

[30] Foreign Application Priority Data

Feb. 22, 1994 [JP] Japan ................................ 6-024090
Aug. 31, 1994 [JP] Japan ................................ 6-207178

[51] Int. Cl.$^6$ .......................... H01L 21/8234; H01L 21/76
[52] U.S. Cl. .......................... 438/275; 438/401; 438/975
[58] Field of Search ........................... 355/53; 438/275, 438/401, 975

[56] References Cited

U.S. PATENT DOCUMENTS 5,780,188  7/1998  Rolson ................................ 430/330

*Primary Examiner*—Brian Dutton
*Attorney, Agent, or Firm*—Oblon, Spivak, McClelland, Maier & Neustadt, P.C.

[57] ABSTRACT

A method of manufacturing power semiconductor device, having an area of 3 cm$^2$ or more, comprises the step of preparing a power semiconductor device divided into cell blocks and forming power semiconductor elements whose minimum linewidth is less than 10 μm and having at least main electrodes completed in the cell blocks, the step of determining cell blocks having faulty portions, and the step of selectively electrically separating the main electrodes in the faulty cell blocks from the main electrodes in the good cell blocks.

18 Claims, 11 Drawing Sheets

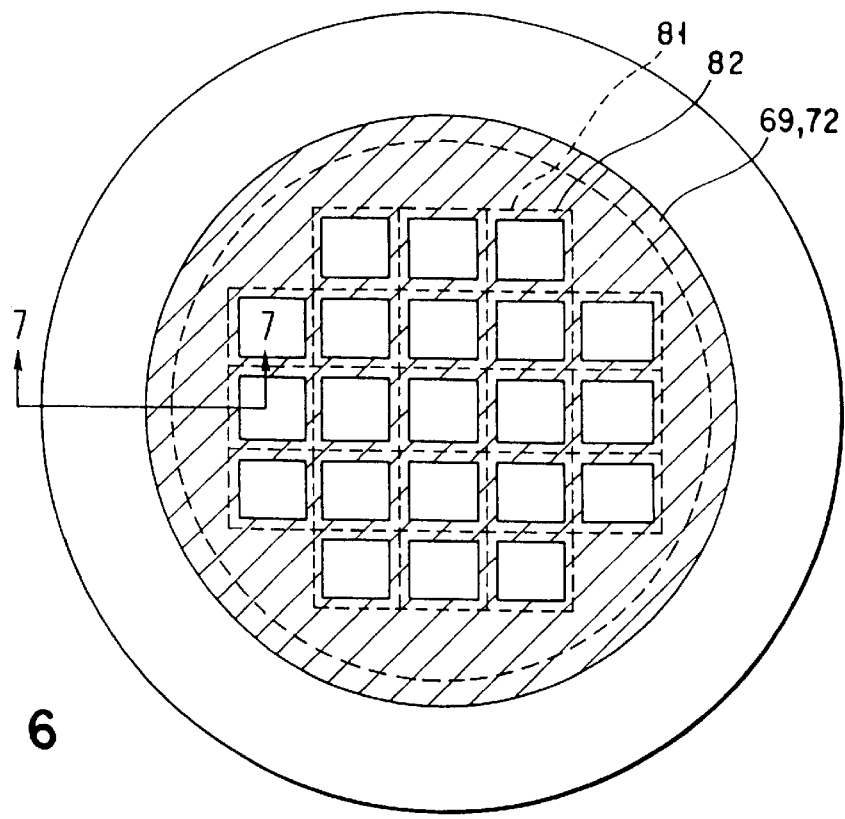
F I G. 6
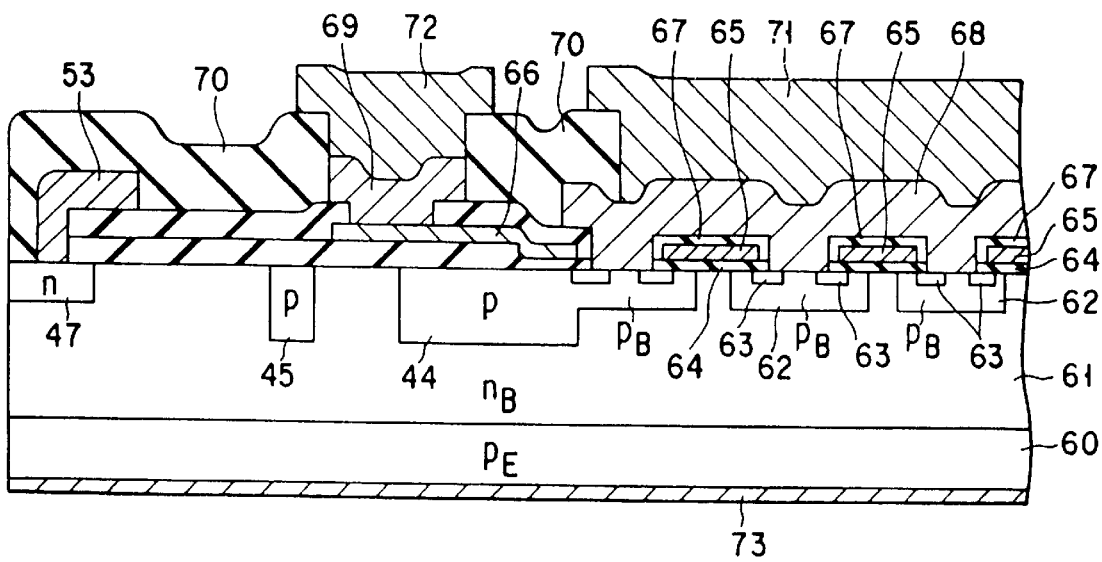
F I G. 7

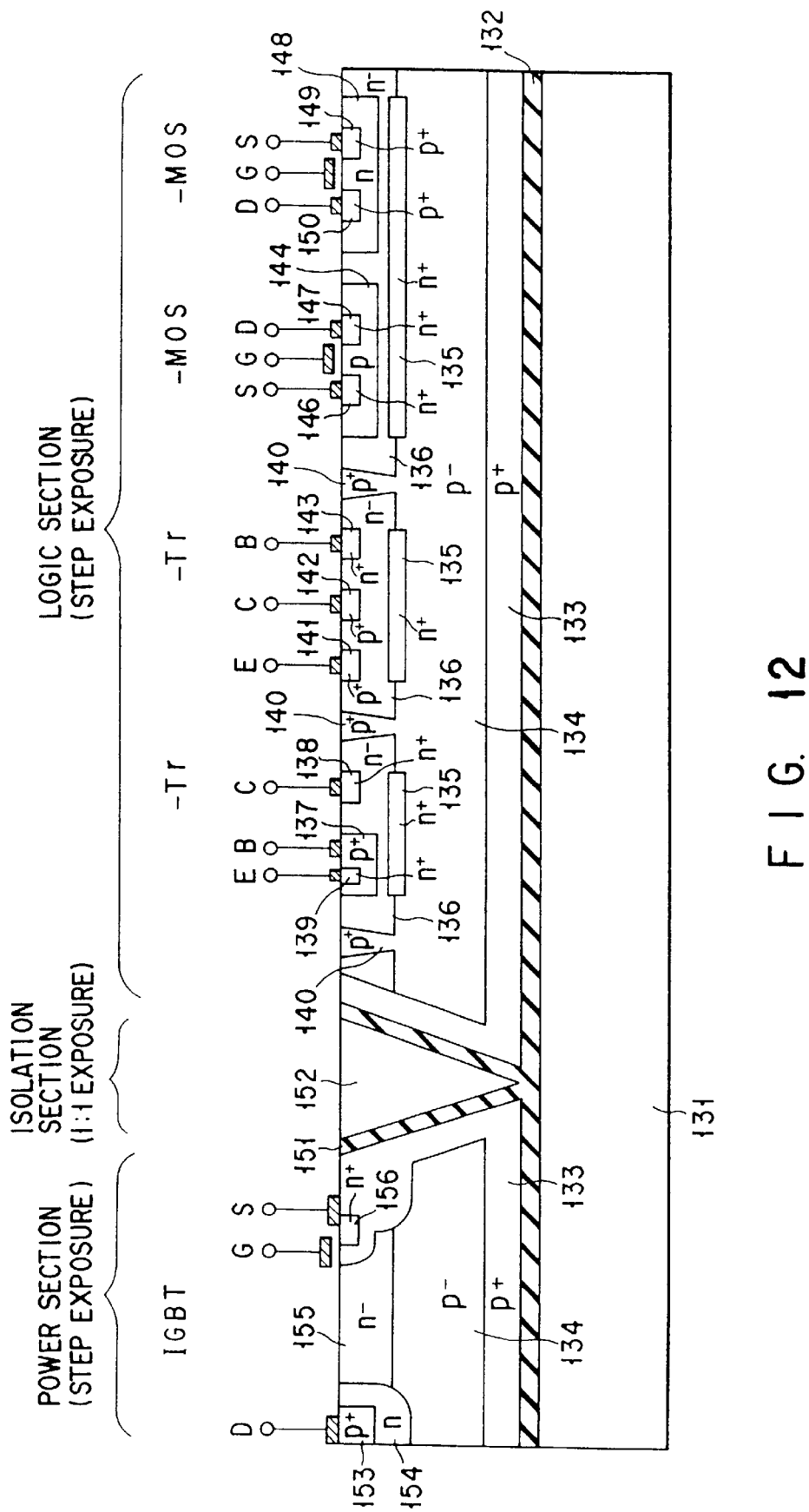
F I G. 12

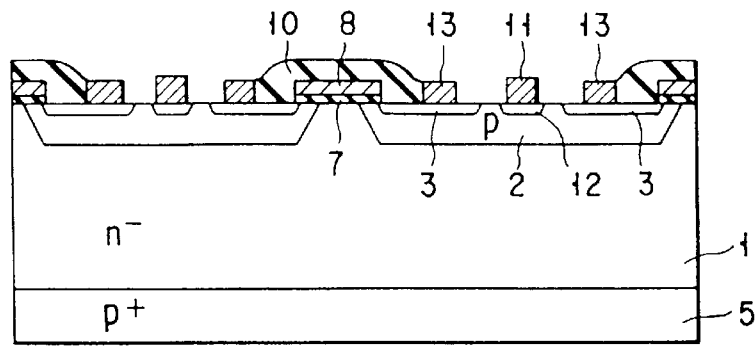
F I G. 15A
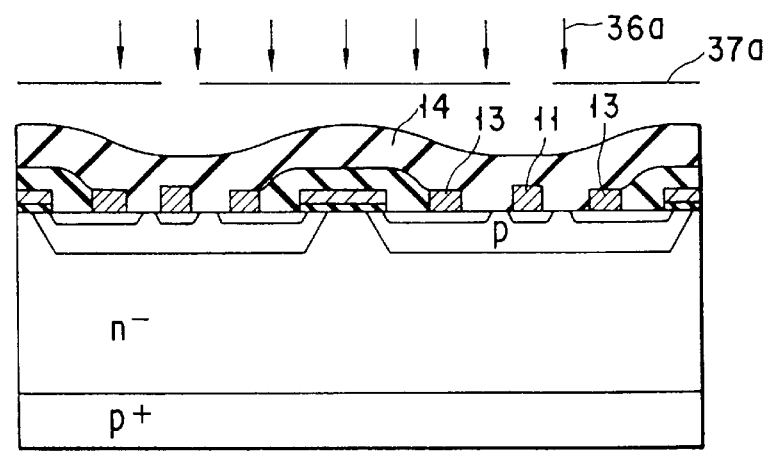
F I G. 15B
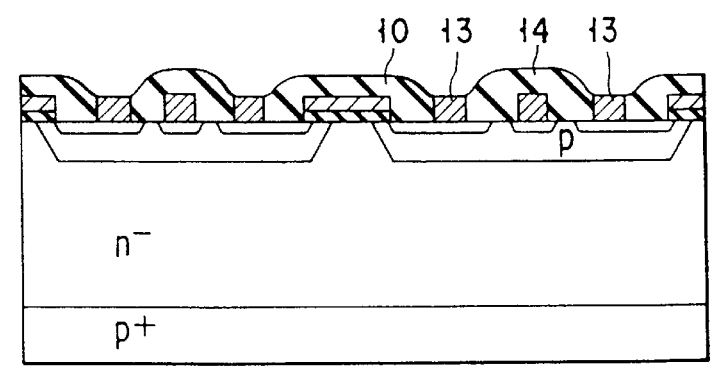
F I G. 15C
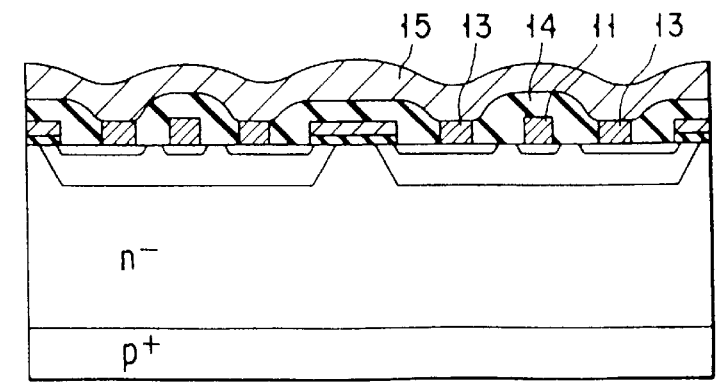
F I G. 15D

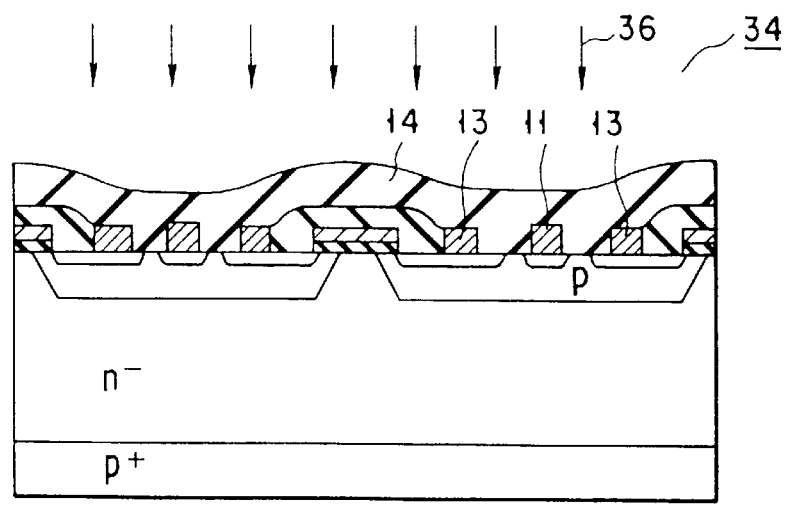
F I G. 16A
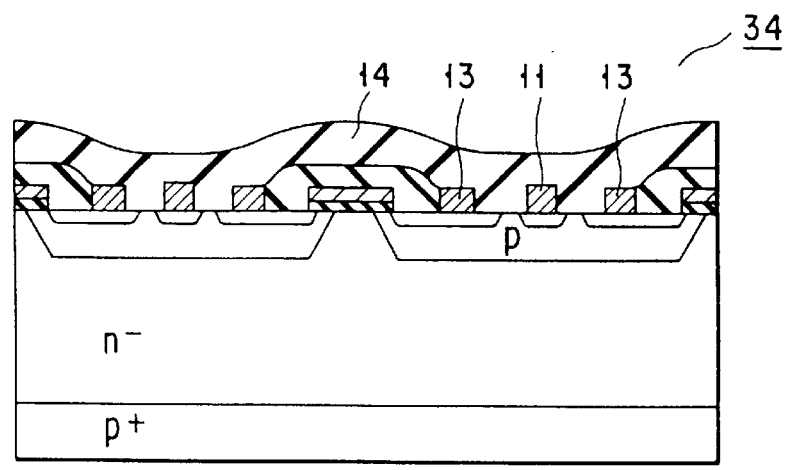
F I G. 16B
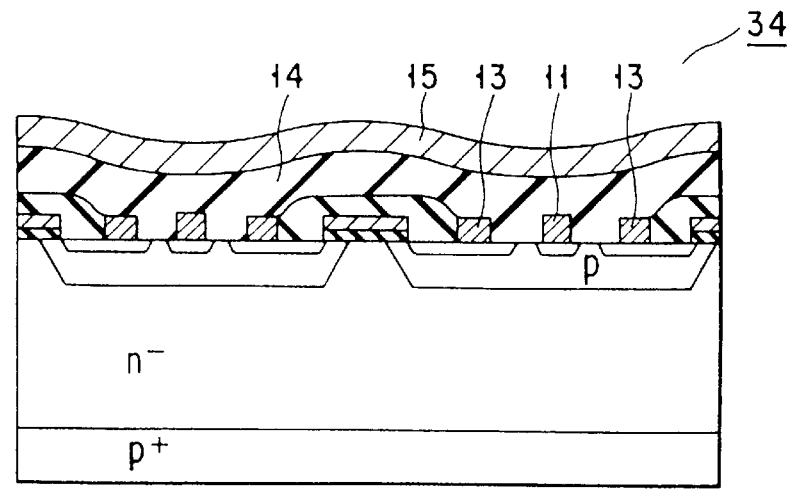
F I G. 16C

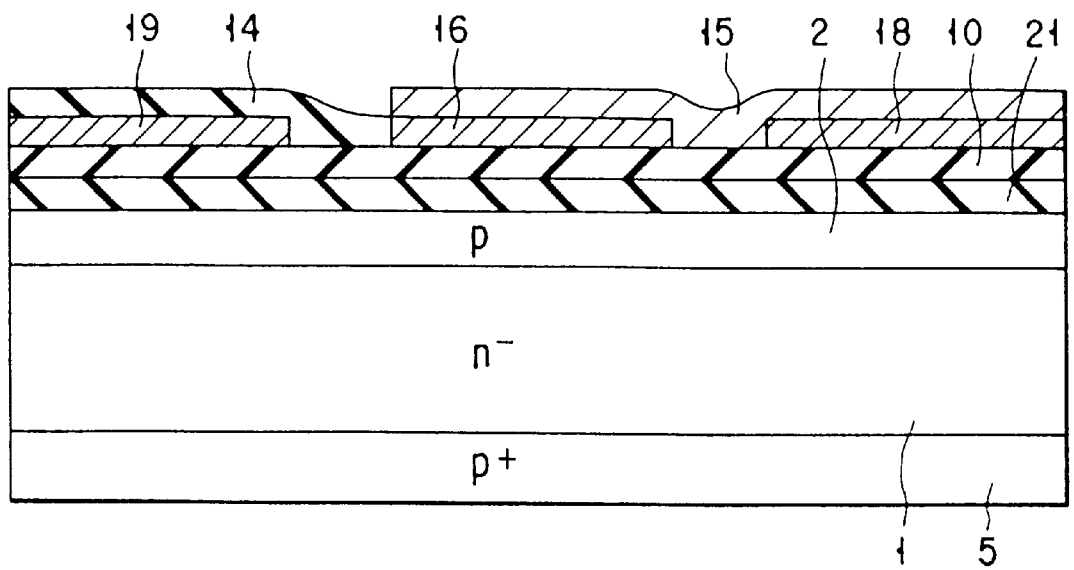
F I G. 19
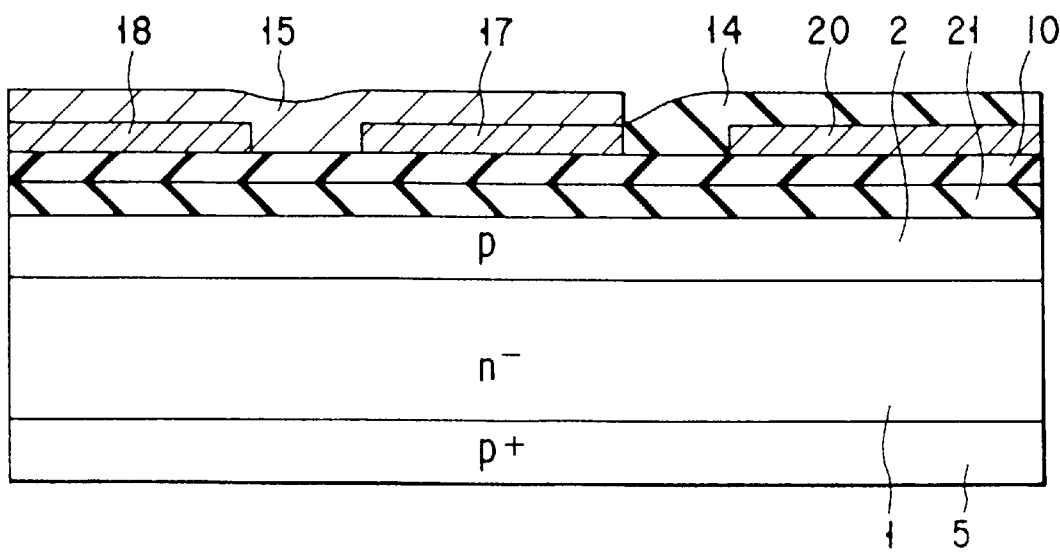
F I G. 20

METHOD OF MANUFACTURING POWER SEMICONDUCTOR DEVICES

CROSS-REFERENCE TO RELATED APPLICATIONS

This application is a continuation-in-part of U.S. patent application Ser. No. 08/392,320, filed Feb. 22, 1995, now abandoned.

BACKGROUND OF THE INVENTION

This invention relates to a method of manufacturing power semiconductor devices composed of such power semiconductor elements as IGBTs or GTOs.

Since the power semiconductor device is required to have a great current-carrying capability, in general, its area is larger than that of any other semiconductor device. In the exposure step in forming power semiconductor devices in a wafer, an exposure apparatus that exposes the entire surface of the wafer at a time at the projection reduction ratio of 1:1 (hereinafter, referred to as the 1:1 entire surface exposure apparatus) is used.

In the 1:1 entire surface exposure apparatus, the minimum dimension that can be exposed is approximately 10 $\mu$m, and the alignment allowance is approximately 1 $\mu$m. The accuracy of that order is sufficient for manufacturing conventional power semiconductor devices.

Recently, there have been strong demands toward improving the functions of power semiconductor devices, and therefore it is necessary to make power semiconductor elements much finer. As a result, the exposure accuracy tends to be more strict. Specifically, exposure accuracy with a minimum exposure dimension of nearly 1.0 $\mu$m and alignment allowance of nearly 0.5 $\mu$m has been required.

To meet such requirements, it is more desirable to use the reduction projection-type exposure apparatus (hereinafter, referred to as the stepper exposure apparatus) with the projection reduction ratio 5:1 that the 1:1 entire surface exposure apparatus.

The maximum size that can be exposed in one shot of the stepper exposure apparatus is approximately 15 mm×15 mm. Therefore, when a power semiconductor device is larger than the maximum size, it is impossible to expose all of the element areas on the wafer in one shot. Thus, to expose all of the device areas, more than one shot must be taken.

Furthermore, the power semiconductor device has a non-repetitive pattern such as a junction termination area at the peripheral portion thereof. Therefore, in general, even if more than one shot is taken, the same patterns are not repeated. Accordingly, in the worst case, one exposure step also requires as many exposure masks as more than one shot.

As a result, the stepper exposure apparatus alone has a disadvantage in that the work efficiency drops significantly although the exposure accuracy is higher.

Furthermore, as power semiconductor elements will be made much finer in the future, it is expected that conventional manual repairing will be more difficult and consequently repairing efficiency will deteriorate.

BRIEF SUMMARY OF THE INVENTION

A method of manufacturing power semiconductor device, having an area of 3 cm$^2$ or more according to the present invention, each power semiconductor device, composed of a plurality of semiconductor elements, having a fine pattern whose minimum linewidth is less than 10 $\mu$m, comprises the step of forming the fine pattern by the step including the step exposure, the step of forming a non-fine pattern of the power semiconductor device by the step including the 1:1 entire surface exposure, and the step of forming an alignment mark, in an active area of the power semiconductor device, used in the step exposure and the 1:1 entire surface exposure.

In the invention, step exposure means exposing part of the wafer at a projection reduction ratio of, for example, 5:1.

Furthermore, 1:1 entire surface exposure means exposing the entire surface of the wafer at a time at a projection reduction ration 1:1.

Additionally, an active area means an area except for a junction termination area, an electrode pad area, an element separation area and a dicing area from the entire area of the power semiconductor device.

With the invention, since of all the patterns, the non-fine ones that is not required to be exposed by step exposure are formed by 1:1 entire surface exposure, the fine ones are formed by repeating step exposure, accurate patterns can be formed, minimizing a drop in the exposure work efficiency.

Furthermore, without different fine patterns, the necessary number of exposure masks in one exposure step is each one alone for 1:1 entire surface exposure and for step exposure.

In addition, more specifically, the present invention is effective in forming the fine pattern whose minimum work dimension is 5 $\mu$m or less. The reason is that such fine patterns cannot be formed by 1:1 entire surface exposure but they can be formed by step exposure alone.

By the way, the power semiconductor device of 1000-A rated current is required to have a rated current density of approximately 50 A/cm$^2$. In this case, the area of the power semiconductor device is approximately 20 (=1000/50) cm$^2$. Accordingly, the present invention is effective in case of the area of 20 cm$^2$ or more.

Furthermore, in case of 2000-A, 3000-A and 6000-A rated currents, the rated current density of approximately 50 A/cm$^2$ is required. In this case, the area of the power semiconductor device is 40 cm$^2$, 60 cm$^2$ and 120 cm$^2$, respectively. Accordingly, the present invention is also effective in case of the area of 40 cm$^2$ or more, 60 cm$^2$ or more, and 120 cm$^2$ or more. That is, a preferable area is a discrete value.

Additionally, such a method of manufacturing power semiconductor devices with use of step exposure and 1:1 entire surface exposure can be applied to repairing faulty portions of the power semiconductor device.

That is, another method of manufacturing power semiconductor device according to the present invention, each power semiconductor device, having an are of 3 cm$^2$ or more, composed of an area divided into a plurality of cell blocks and power semiconductor elements formed in the cell block, having a fine pattern whose minimum linewidth is less than 10 $\mu$m, comprises the element forming step of forming the fine pattern by the step including the step exposure and of forming a non-fine pattern of the power semiconductor device by the step including the 1:1 entire surface exposure, the step of forming an alignment mark, in an active area of the power semiconductor device, used in the step exposure and the 1:1 entire surface exposure, the step of determining cell blocks having faulty portions, and the step of forming interconnection lines by step exposure so that the main electrodes in the cell blocks having the faulty portions may be selectively electrically separated from the main electrodes in the cell blocks having no faulty portions.

With the invention, in the first place, a power semiconductor device having an area divided into cell blocks is prepared, and power semiconductor elements having main electrodes in the cell blocks are formed.

Preferably, patterns in the area divided into cell blocks (normally, fine patterns) are formed for each cell block by repeating step exposure, and patterns in any other area except for the cell blocks (normally, non-fine patterns) are formed by 1:1 entire surface exposure.

Then, in the invention, the cell blocks having faulty portions are determined. This step permits the cell blocks having faulty portions (faulty cell blocks) to be distinguished from the cell blocks having no faulty portions (good cell blocks).

Then, in the invention, the main electrodes in the faulty cell blocks are selectively electrically separated from the main electrodes in the good cell blocks. Namely, the power semiconductor elements in the faulty cell blocks are prevented from being used. When the number of faulty cell is plural, the main electrode is separated for each faulty cell block.

As described above, with the invention, since a cell block is used as a unit of repair (separation of the main electrode), use of, for example, a repair system for a stepper exposure system enables only the main electrodes in the faulty cell blocks to be selectively electrically separated from the main electrodes in the good cell blocks with ease.

Therefore, it is possible to repair faulty portions efficiently with a machine, and consequently prevent the repairing work efficiency from deteriorating due to a tendency toward finer power semiconductor elements.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a plan view of a wafer to help explain an exposure method according to a second embodiment of the present invention;

FIG. 7 is a sectional view of the wafer taken along line 7—7 of FIG. 6;

FIG. 12 is a sectional view of a power IC according to a sixth embodiment of the present invention.

FIGS. 15A to 15D are sectional views of processes to help explain a method of repairing good cell blocks according to a seventh embodiment of the present invention;

FIGS. 16A to 16C are sectional views of processes to help explain a method of repairing faulty cell blocks in a seventh embodiment of the present invention;

FIG. 19 is a sectional view taken along line 19—19 of FIG. 18;

FIG. 20 is a sectional view taken along line 20—20 of FIG. 18; and FIGS. 21A to 21C are sectional views of processes to help explain a repairing method according to an eighth embodiment of the present invention.

DETAILED DESCRIPTION OF THE INVENTION

Hereinafter, referring to the accompanying drawings, embodiments of the present invention will be explained.

(First embodiment)

Figure 1:
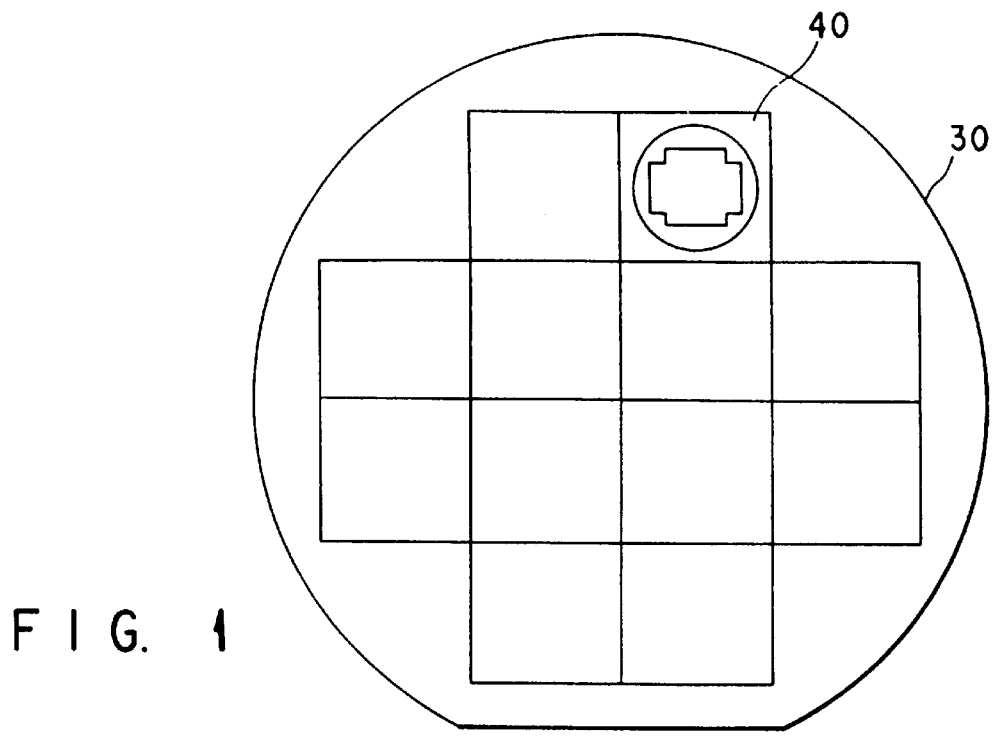
FIG. 1 is a plan view of a wafer to help explain an exposure method according to a first embodiment of the present invention.
Figure 2:
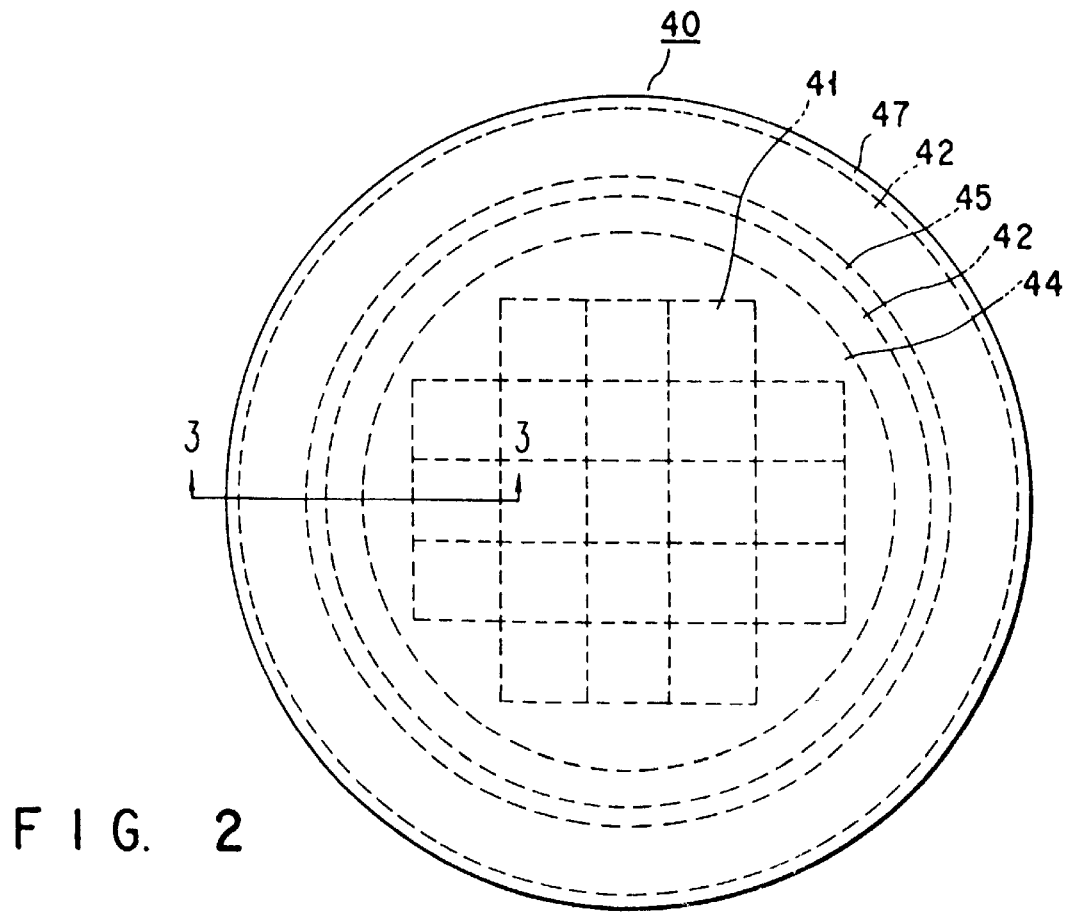
FIG. 2 is a detailed plan view of a portion of the wafer of FIG. 1.

FIG. 1 is a plan view of a wafer to help explain an exposure method according to a first embodiment of the present invention. In the figure, numeral 30 indicate a wafer. In the wafer 30, a plurality of power semiconductor devices 40 are formed. The diameter of the wafer shown in FIG. 30 is, for example, 75 mm. The size of a semiconductor device 40 is 17 mm, and its area is approximately 3 cm$^2$. As described below, since the center portion of the semiconductor device 40 comprises patterns whose minimum dimension (minimum linewidth) is 1 µm, the stepper exposure apparatus must be used in respect to accuracy so as to form the semiconductor device. However, the maximum size that can be exposed in one shot with the stepper exposure apparatus is approximately 15 mm×15 mm. Therefore, the semiconductor device 40 cannot be formed in one shot of the stepper exposure apparatus. Accordingly, heretofore, the semiconductor device 40 must have been manufactured by more than one shot. In order to form non-periodical patterns such as junction termination portion patterns shown by a circular line, a plurality of masks must be prepared and combined with one another for exposing. Therefore, in respect to a work efficiency, since manufacturing by more than one shot is impractical, it is not put to practical use. FIG. 2 is a plan view of the semiconductor device 40 alone. For convenience for explanation, such a large apparatus that the semiconductor device 40 has a diameter of 70 mm will be described. A square area 41 shown by broken lines indicates an area that is exposed in one shot of a stepper exposure apparatus (one shot area), and its area is, for example, 10 mm×10 mm. An exposure pattern of a fine pattern in one shot is omitted here.

In a one-shot area 41, a power semiconductor element area composed of Schottky diodes etc. is formed. Around the 21 one-shot areas, a junction termination area is formed. Here, the non-fine pattern for the junction termination area is omitted.

Figure 3:
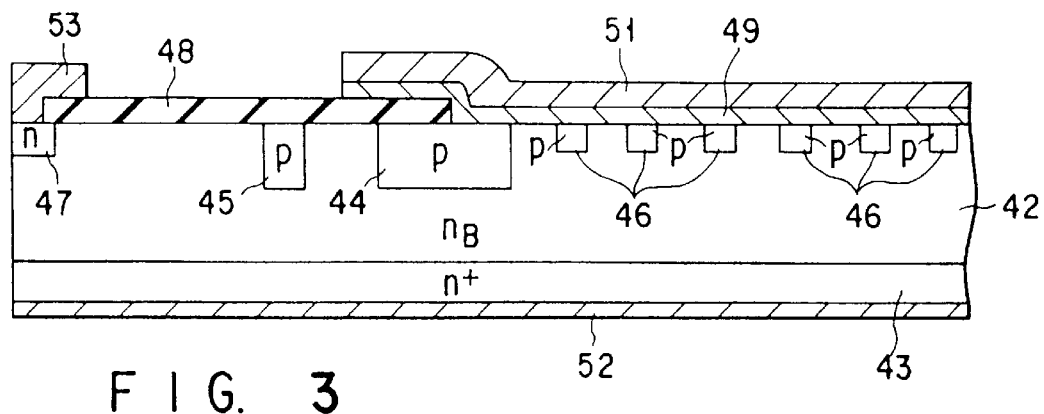
FIG. 3 is a sectional view of the wafer taken along line 3—3 of FIG. 2.

FIG. 3 is a sectional view of the power semiconductor device 40 taken along line 3—3 of FIG. 2, where the power semiconductor element area and junction termination area are shown. In the figure, numeral 42 indicates an n-type base layer. Above the n-type base layer 42, an anode electrode 51 is formed via a Shottky barrier metal layer 49 (e.g., a molybdenum layer).

At the surface of the n-type base layer 42, fine p-type guard rings 46 are formed at regular intervals. Specifically, the distance between two p-type guard ring layers 46 is 2 µm, and the width of the p-type guard ring layer 46 is 1 µm. These p-type guard ring layers 46 are provided to achieve reverse blocking voltage of the Schottky surface. At the surface of the n-type vase layer 42 around these p-type guard ring layer 46, a p-type guard ring 44 is selectively formed to protect the outer circumference of the Schottky surface.

Around the p-type guard ring layer 44, that is, at the surface of the n-type vase layer 42 in the junction termination area, a p-type guard ring layer 45 is selectively formed to achieve high reverse blocking voltage. At the surface of the n-type base layer 42 around the p-type guard ring layer 45, an n-type channel stopper layer 47 is selectively formed. The n-type channel stopper layer 47 is provided with an electrode 53. The electrode 53 is isolated by an insulated film 48 from an anode electrode 51 etc.

On the other hand, a cathode electrode 52 is formed on the entire bottom surface of the n-type base layer 42 via an n$^+$-type semiconductor layer 43.

An exposure method for manufacturing such power semiconductor devices 40 is as follows.

In manufacturing the semiconductor device shown in FIG. 3, each pattern must be formed in a resist by a plurality of exposure steps for patterning p-type guard ring layers 44, 46, for patterning fine p-type guard ring layers 46, for patterning an n-type channel stopper 47, for patterning an insulating film 48, for patterning a shot key barrier metal layer 49 and an anode electrode 51. Among them, a resist pattern for the p-type guard ring layers 46, fine semiconductor layers, is formed by means of a stepper exposure apparatus, and a resist pattern for the remaining non-fine portions is formed by means of a 1:1 entire surface exposure apparatus. In other words, the exposure of the junction termination area is effected using the 1:1 entire surface exposure apparatus, and the exposure of the power semiconductor element area is performed using the stepper exposure apparatus and 1:1 entire surface exposure apparatus.

Figure 4:
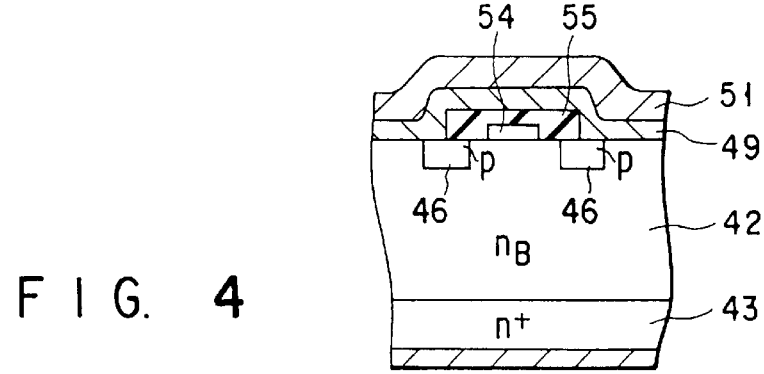
FIG. 4 is a sectional view of the alignment mark portion.

In the embodiment, since the stepper exposure apparatus is used only for forming a resist pattern for the p-type guard layers 46, a stepper alignment mark is not necessary. On one hand, an alignment mark is necessary for aligning the position between the 1:1 entire surface exposure apparatus and stepper exposure apparatus. In the first place, both the apparatuses use quite different kinds of semiconductor devices, respectively. Therefore, since there is no consideration that both the apparatuses are combined and used with each other, both the alignment marks are not compatible at all. Accordingly, in the invention, both the alignment marks are formed in one wafer, whereby both kinds of exposure apparatuses can be combined and used with each other, which, heretofore, has not been considered at all. There can be a method of forming, in the 1:1 entire surface exposure apparatus, alignment marks for the 1:1 entire surface exposure apparatus itself and stepper exposure apparatus, and a method of forming, in the stepper exposure apparatus, alignment marks for the stepper exposure apparatus itself and 1:1 entire surface exposure apparatus. The alignment mark for the stepper exposure apparatus is so fine that its minimum dimension is, for example, approximately 2 µm. Accordingly, so as to form an alignment mark having a high accuracy, the alignment mark for the stepper exposure apparatus cannot be formed in the 1:1 entire surface exposure apparatus. Therefore, the invention adopts the method of forming, in the stepper exposure apparatus, alignment marks for the stepper exposure apparatus itself and 1:1 entire surface exposure apparatus. In this case, an alignment mark is formed in each shot of stepper exposure. For example, referring to FIG. 2, there provided such an unprecedented manufacturing method that an alignment mark is formed in each of twenty-one exposure shot areas 41, that is, an active element area (an area except for a junction termination area, an electrode pad area, an element separation area and a dicing area, i. e. an area where non-fine patterns are formed). In the invention, to prevent the alignment mark formed in the active element area from having an adverse effect on the element's characteristics, the alignment mark 54 is covered with an insulating film 55 whose patterns are formed by the 1:1 entire surface exposure apparatus, as shown in FIG. 4, for example.

As is the embodiment, by forming only a fine resist pattern that cannot be formed by the 1:1 entire surface exposure apparatus, by means of the stepper apparatus, and forming the other resist patterns by means of the 1:1 entire surface exposure apparatus, good (accurate) resist patterns can be formed with a minimum drop in the work efficiency.

Figure 5:
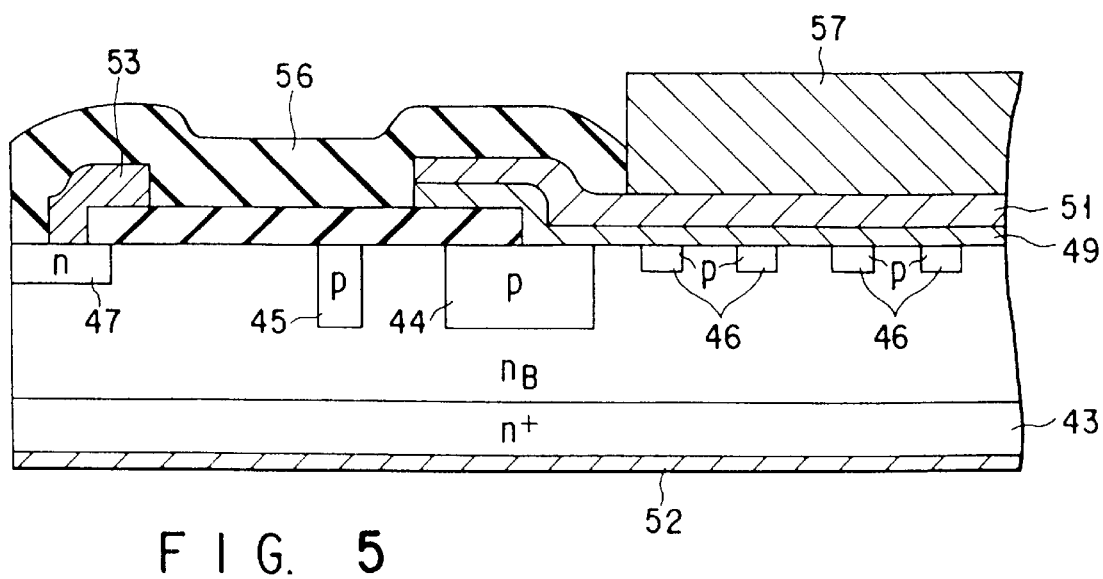
FIG. 5 is a sectional view of an element using a press-package-use structure.

Power semiconductor devices are often used in press-packages. In this case, as shown in FIG. 5, an interlayer insulating film 56 and a second anode electrode 57 for press-pack-structure may be formed by means of the 1:1 entire surface exposure apparatus.

Figure 9:
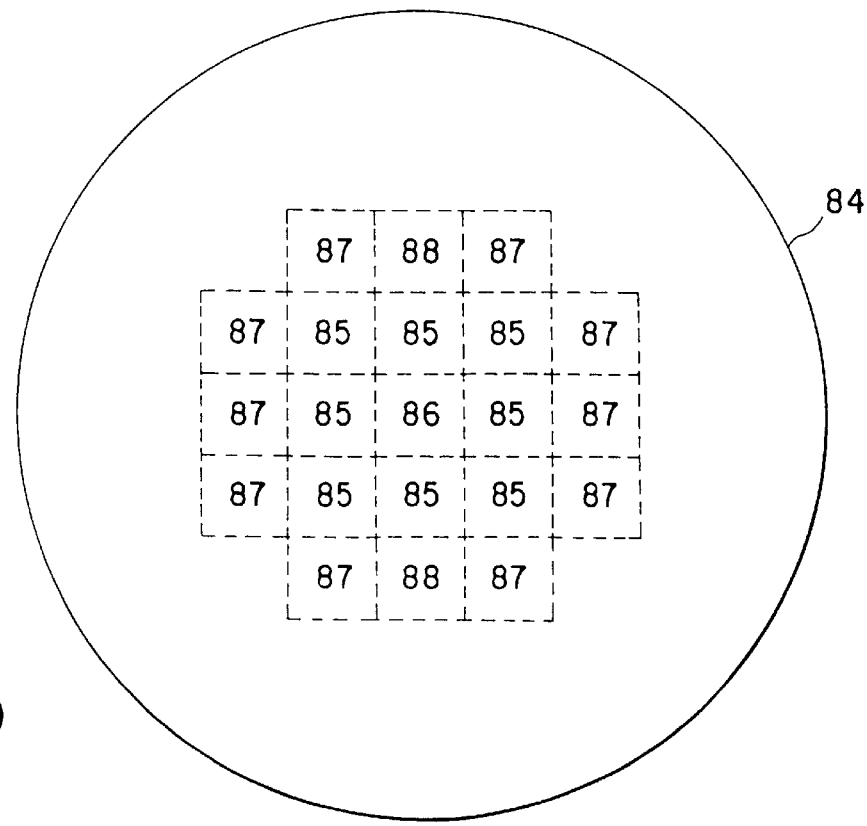
FIG. 9 is a plan view of a wafer to help explain an exposure method according to a third embodiment of the present invention.

While in the embodiment, the case where 12 power semiconductor devices 40 are formed in the single wafer 30 has been explained as shown in FIG. 9, the invention may be applied to a much larger semiconductor device. For instance, the invention may be applied to a case where a single power semiconductor device is formed in a single wafer.

In this case, in FIG. 2, a single power semiconductor device 40 indicated by a solid line corresponds to a single wafer, and the above explanation holds true.

(Second embodiment)

FIG. 6 is a plan view of a power semiconductor device to help explain an exposure method according to a second embodiment of the present invention. FIG. 7 is a sectional view of the power semiconductor device 40 taken along line 7—7 of FIG. 6.

A square area 81 indicated by broken lines indicates an area (one shot area) that can be exposed in one shot of a stepper exposure apparatus. A fine exposure pattern in one shot is omitted here.

This embodiment differs from the previous embodiment in that an IGBT is formed in the power semiconductor element area instead of a Shottky diode.

In FIG. 7, numeral 61 indicates an n-type base layer. At the surface of the n-type base layer 61, p-type base layer 62 are selectively formed. At the surface of the p-type base layer 62, n-type source layers 63 are selectively formed. Above the p-type base layer 62 sandwiched between the n-type source layer 63 and the n-type base layer 61, a gate electrode 65 is formed via a gate insulating film 64.

The p-type base layer 62 and n-type source 63 are provided with a first cathode electrode 68. The first cathode electrode 68 is isolated from the gate electrode 65 by an insulating film 67. On the first cathode electrode 68, a second cathode electrode 71 is provided.

In the figure, numeral 66 indicates a gate wire (gate connection layer) connected to the gate electrode 65. The draw gate wire 66 must be formed at regular intervals to reduce the gate resistance when the gate electrode 65 is fine and the semiconductor chip has a large area. Although FIG. 15 shows only one place, the area where they formed is, actually, a gate wire area 82 between the square area 81 shown by broken lines and the square area shown by solid lines in FIG. 6. The gate wire area 82 is an alignment mark area for step exposure. That is, an alignment mark is formed in the gate wire area 82.

On the draw gate wire 66, a first outlet gate electrode 69 is provided. On the first outlet gate electrode 69, a second outlet gates electrode 72 is provided. These outlet gate electrodes 69, 72 are for taking out the gate in a press-pack-structure. The areas where they are formed may be all of the areas shown by the shaded portions in FIG. 6, or only the ringed portion in the periphery of the shaded portion enclosed by a solid line and a broken line. These outlet gate electrodes 69 and 72 are isolated from the cathode electrodes 68, 71 and the stopper 53 by an interlayer insulating film 70.

On the other hand, on the bottom surface of the n-type base layer 61, a drain electrode 73 is provided via an p-type emitter layer 60.

The junction termination area is the same as that in the previous embodiment. The portions corresponding to each layer of the junction termination area of FIG. 3 are indicated by the same symbols as those in FIG. 3.

An exposure methods for manufacturing such power semiconductor devices is as follows.

The resist patterns for the gate electrode 65 and the n-type source layer 63 of fine patterns and the contact holes through which the cathode electrode 68 is in contact with the silicon surface, are formed using a stepper exposure apparatus. The resist patterns for the remaining portions are formed by means of a 1:1 entire surface exposure apparatus.

In the embodiment, since the stepper exposure apparatus is used to form resist patterns for a plurality of layers including the gate electrode 65 and n-type source layers 63, a stepper alignment is performed. The formation of alignment marks is performed as described in the first embodiment. In the embodiment, the position where the alignment mark is formed in the active element area is disposed in the gate wire area 82 as described above. Accordingly, the semiconductor device can be effectively formed without using an area in vain.

When the opening portions in the insulating film are used as a stepper alignment mark, there is a possibility that the gate wire 66 appearing at the bottom of the opening portions will come into contact with conducting parts such as electrodes formed in subsequent process, thus degrading the characteristics of the element. To avoid this, when an insulating film resist pattern is formed by the 1:1 entire surface exposure apparatus, such a resist pattern as closes the opening portions with an insulating film is formed, thereby closing the opening portions with an insulating film.

In this embodiment, too, since only a fine resist pattern that cannot be formed by the 1:1 entire surface exposure apparatus, is formed using the stepper apparatus, and the other resist patterns are formed by means of the 1:1 entire surface exposure apparatus, good (accurate) resist patterns can be formed with a minimum drop in the work efficiency.

Figure 8:
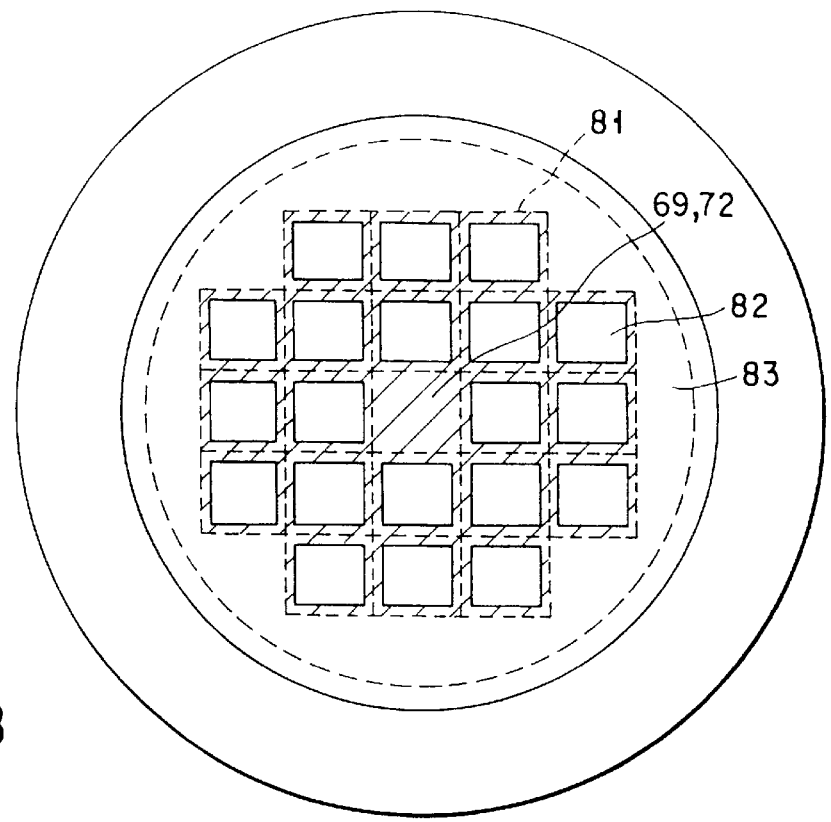
FIG. 8 is a plan view of a modification of the wafer of FIG. 7.

While in the embodiment, the outlet gate electrodes 69 and 72 are formed outside the 21 one-shot areas, they may be formed in the shaded portion 83 within the 20 one-shot areas as shown in FIG. 8.

In the embodiment, the case where the on-shot areas of the stepper exposure apparatus are adjacent to each other, that is, the case where the one-shot areas 81 are adjacent to each other in FIG. 6 has been explained. In the case where the stepper exposure alignment mark area 82 is smaller than the gate wire area, for example, the distance between one-shot areas of the stepper exposure apparatus is made linger as much as desired.

(Third embodiment)

FIG. 9 is a plan view to help explain an exposure method according to a third embodiment of the present invention.

In the figure, numeral 84 indicates a single semiconductor device. A one-shot area of a stepper exposure apparatus is represented by a square in broken lines, and the remaining portions are omitted.

This embodiment is characterized in that a plurality of different cell area are formed on a single large area semiconductor device by effecting step exposure using a plurality of different masks.

In the figure, for example, a one-shot area 85 is an are where an IGBT is formed, a one shot area 86 is an area where the gate circuit of an IGBT is formed, a one-shot area 87 is an area where a reverse conducting diode is formed, and a one-shot area 88 is an area where a overvoltage an overcurrent protective circuit is formed. Although neither the junction termination area nor the wiring area between one-shot areas of the stepper exposure apparatus are shown, they are formed using a 1:1 entire surface exposure apparatus. With this embodiment, a large-area composite device containing a power section and a logic section can be formed.

(Fourth embodiment)

Hereinafter, an exposure methods according to a fourth embodiment of the present invention will be explained. This embodiment is an example of a power semiconductor device where a plurality of the same MOS thyristors are integrated into a wafer.

Figure 10:
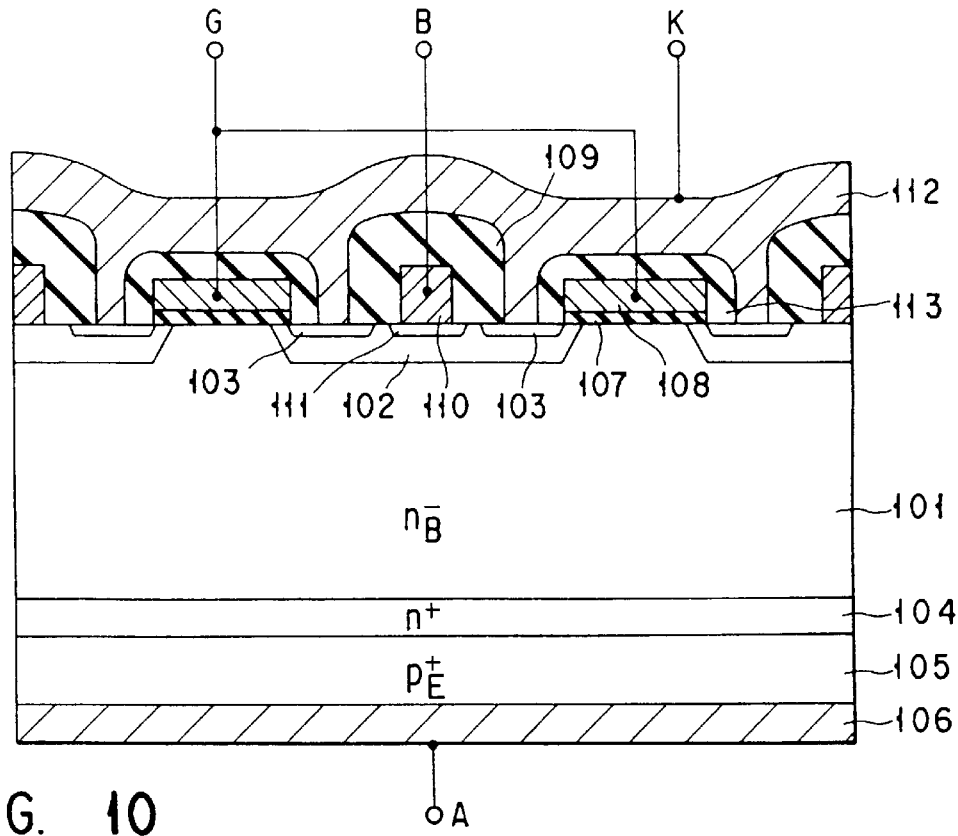
FIG. 10 is a sectional view of a MOS thyristor according to a fourth embodiment of the present invention.

FIG. 10 is a sectional view of a MOS thyristor. In this figure, numeral 105 indicates a $p^+$-type emitter layer provided with an anode electrode 106. On the $p^+$-type emitter layer 105, an n-type base layer 101 is provided via an $n^+$-type buffer layer 104. At the surface of the $n^-$-type base layer 101, p-type base layers 102 are selectively formed. At the surface of the p-type base layer 102, $n^+$-type emitter layers 103 are selectively formed. Above the p-type base layer 102 sandwiched between the $n^+$-type emitter layer 103 and the $n^-$-type base layer 101, a gate electrode 108 is provided via a gate insulting film 107.

At the surface of the p-type base layer 102, a $p^+$-type diffusion layer 111 is selectively formed. The $p^+$-type diffusion layer 111 is provided with a control electrode 110. The control electrode 110 is electrically separated from the gate electrode 108 by an electrode isolation insulating film (interlayer insulating film) 109, 113. A cathode electrode 112 is in contact with the $n^+$-type emitter layer 103 via the electrode isolation insulating film 113.

In the MOS thyristor thus constructed, the patterns formed by step exposure include patterns for the gate electrode 108, $p^+$-type diffusion layer 111, $n^+$-type emitter layer 103, and control electrode 110 and patterns for the electrode isolation insulating films 113, 109 with contact holes. The other patterns are formed by 1:1 entire surface exposure.

(Fifth embodiment)

Hereinafter, an exposure method according to a fifth embodiment of the present invention will be explained. This embodiment is an example of a power semiconductor device where a plurality of the same MOS transistors (power MOSFETS) are integrated into a wafer.

Figure 11:
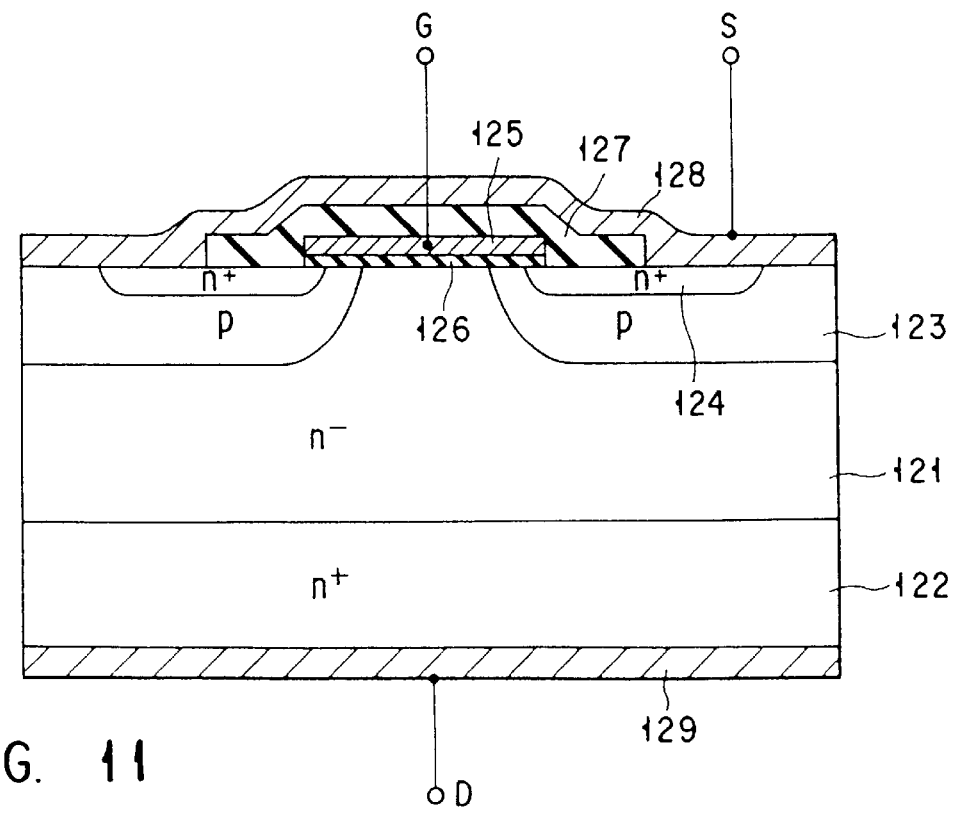
FIG. 11 is a sectional view of a power MOS transistor according to a fifth embodiment of the present invention.

FIG. 11 is a sectional view of a power MOSFET. In the figure, numeral 122 indicates an n$^+$-type drain layer provided with a drain electrode 129. ON the n$^+$-type drain layer 122, an n$^-$-type semiconductor layer 121 is provided. At the surface of the n$^-$-type semiconductor layer 121, p-type semiconductor layer 123 are selectively formed. At the surface of the p-type semiconductor layer 123, n$^+$-type layers 124 are selectively formed. Above the p-type semiconductor layer 123 sandwiched between the n$^+$-type source layer 124 and the n-type semiconductor layer 121, a gate electrode 125 is provided via a gate insulating film 126. A part of the n$^+$-type source layer 124 and the gate electrode 125 are covered with an electrode isolation insulating film 127. The source electrode 128 is in contact with the p-type semiconductor layer 123 and n$^+$-type source layer 124 via the electrode isolation insulating film 127. In the power MOSFET thus constructed, the patterns formed by step exposure include patterns for the gate electrode 125 and n$^+$-type source layer 124 and a pattern for the electrode isolation insulating film 127. The other patterns are formed by 1:1 entire surface exposure.

(Sixth embodiment)

Hereinafter, an exposure method according to an sixth embodiment of the present invention will be explained. This is an example of applying the invention to a power IC.

FIG. 12 is a sectional view of a power IC. The power IC is roughly composed of a power section made up of a lateral IGBT, and a logic section made up a bipolar transistor (biTr) and a MOSFET and controlling the power section.

The power section and logic section are formed in an SOI substrate. The SOI substrate is composed of a support substrate 131, a silicon oxide film 132, and a semiconductor layer formed thereon. Each element is formed in the semiconductor layer.

In the semiconductor layer, an element isolation groove reaching the silicon oxide film 132 is made. On the inside face of the element isolation groove, a silicon oxide film 151 is formed. The element isolation groove is filled with a polysilicon film 152. The elements in the power section are electrically separated from the elements in the logic section by the silicon oxide films 132 and 151. The isolation portion composed of the element isolation groove, silicon oxide film 151, and polysilicon film 152 is formed by 1:1 entire surface exposure.

The lateral IGBT in the power section is roughly composed of a p$^+$-type drain layer 153, an n-type buffer layer 154, an n$^-$-type high-resistance semiconductor layer 155, an n$^+$-type source layer 156, a p$^+$-type low-resistance semiconductor layer 133, and a gate electrode G provided above the p$^+$-type low-resistance semiconductor layer 133. A pattern for the IGBT is formed by step exposure.

The individual elements in the logic section are formed in an n$^-$-type well 136. An npn-biTr is composed of an n$^+$-type emitter layer 139, a p$^+$-type base layer 137, and an n$^+$-type collector layer 138. A pnp-biTr is composed of a p$^+$-type emitter layer 141, an n$^+$-type base layer 143, and a p$^+$-type collector layer 142.

An n-MOSFET is formed in a p-type well 144 in the n$^-$-type well 136. Specifically, the n-MOSFET is composed of a p-type well 144, a pair of n$^+$-type source and drain layers 146 and 147 formed at the surface of the p-type well 144, and gate electrode G provided above the p-type well 144 sandwiched between these n$^+$-type source and drain layers 146 and 147 via a gate insulating film. Similarly, a p-MOSFET is composed of an n-type well 148, p$^+$-type source and drain layers 149 and 150 formed at the surface of the n-type well 148, a gate insulating film, and a gate electrode G.

The individual elements in the logic section are separated from each other by p-n junctions made up of an isolation p$^+$-type layer 140, an isolation n$^+$-type layer, and the p-type layer 134. Each element in the logic section is formed by step exposure. The patterns formed by step exposure include a circuit pattern for the logic section and that for the power section. The patterns formed by 1:1 entire surface exposure are those for the isolation section. The circuit patterns for different functions in the logic section are formed using different masks.

(Seventh embodiment)

Next, a repairing method of power semiconductor devices according to a seventh embodiment of the present invention will be described.

Figure 13:
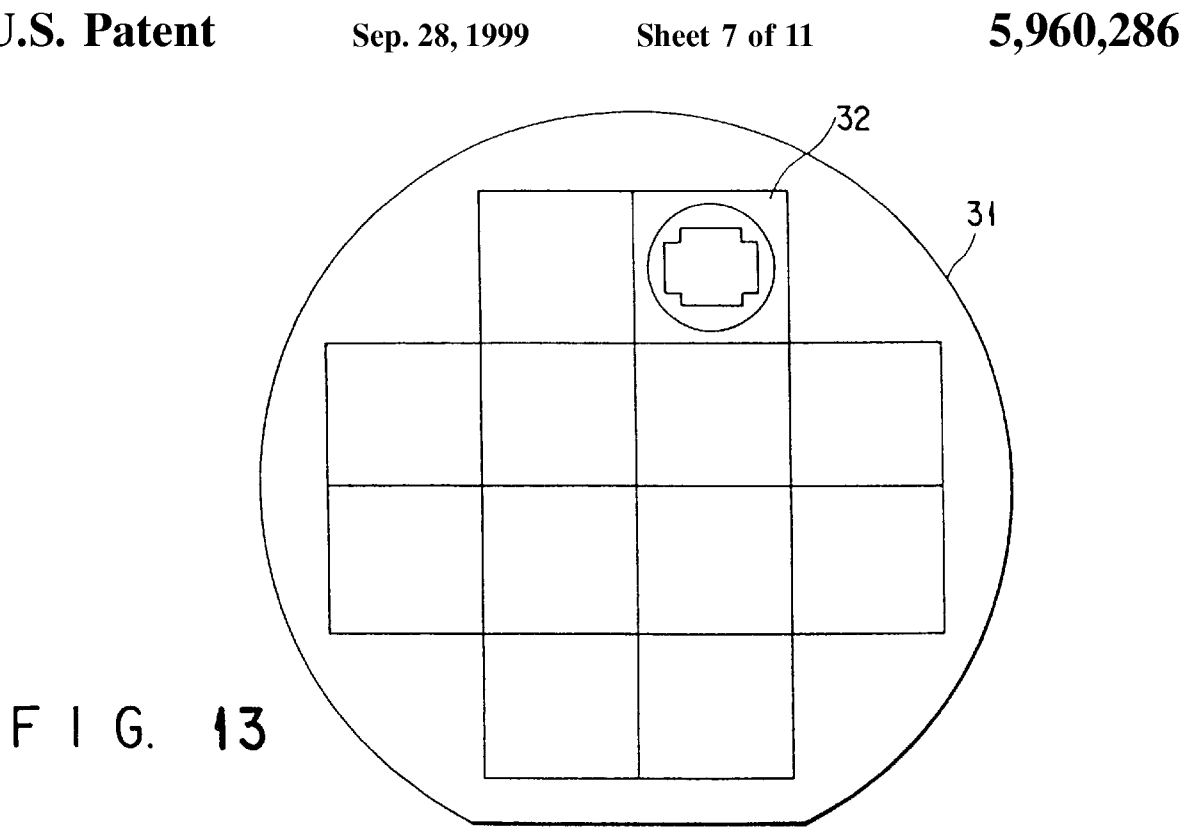
FIG. 13 is a plan view of a wafer to help explain an exposure method according to a seventh embodiment of the present invention.

FIG. 13 is a plan view of a wafer used in the embodiment. In the figure, numeral 31 indicates a wafer. In the wafer 31, twelve power semiconductor devices 32 are formed. The power semiconductor device 32 has an area of 20 cm$^2$ (20 cm×20 cm).

Figure 14:
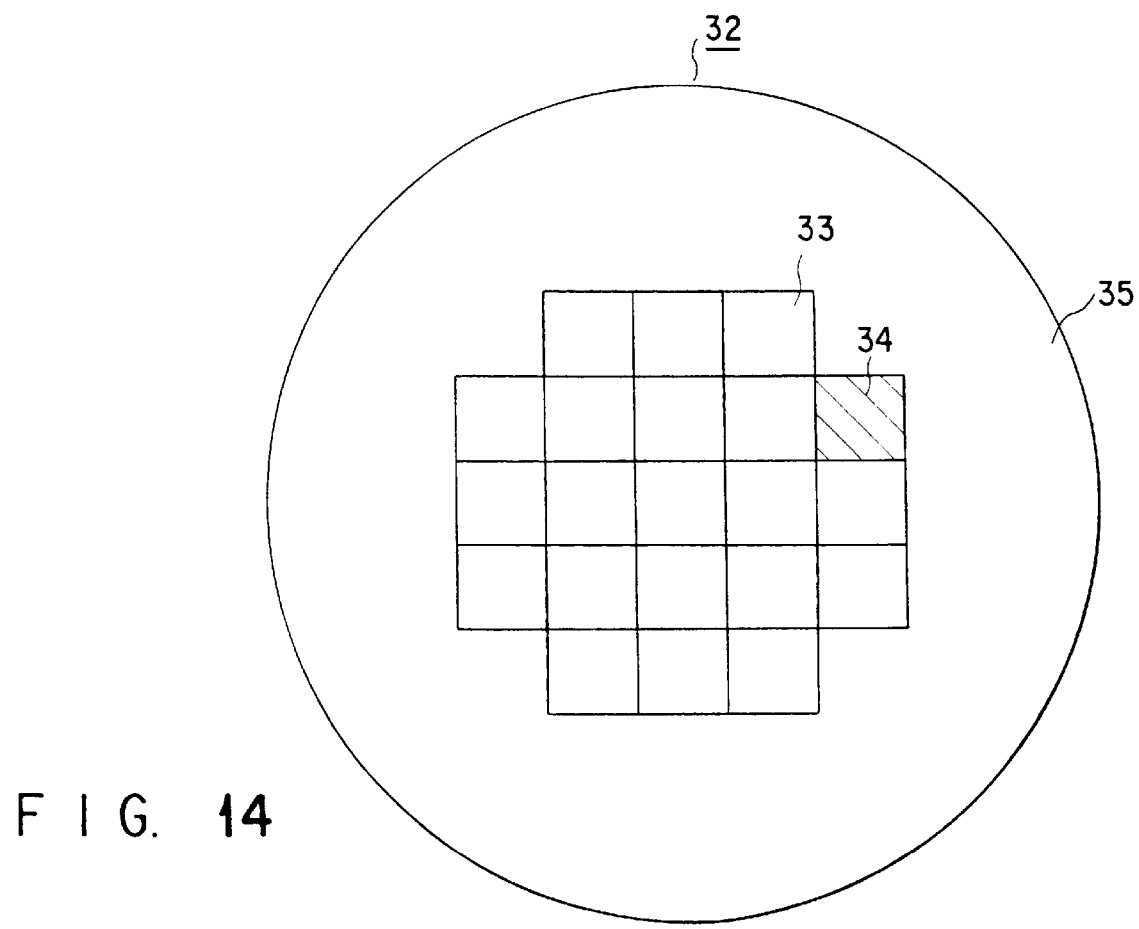
FIG. 14 is a detailed plan view of a portion of the wafer of FIG. 13.

FIG. 14 is a detailed plan view of the power semiconductor device 32. In the power semiconductor devices 32, an area divided into twenty-one cell blocks 33 having the same patterns is formed. Note that an exposure pattern in the cell block 33 is omitted.

The shape and area of the cell block 33 are selected so that the entire area can be exposed in one exposure step (one shot) by means of the stepper exposure apparatus. Furthermore, each of cell blocks 33 normally consists of five to six cell units.

Additionally, in the figure, numeral 34 indicates a cell block having a faulty portion (a faulty cell block). A junction termination area 35 of the power semiconductor device 32 is formed around the cell blocks 33, 34. Patterns of the junction termination area are omitted.

Hereinafter, the power semiconductor device with use of a turn off thyristor with an insulating gate will be specifically described. An alignment mark for the junction termination area and stepper exposure apparatus is formed in accordance with the method described in the first embodiment. Its forming method is omitted here.

FIGS. 15A to 15D and FIGS. 16A to 16C are sectional views of processes to help explain a repairing method related to the embodiment of the present invention. Specifically, FIGS. 15A to 15D are sectional views of processes to help explain a method of repairing good cell blocks. FIGS. 16A to 16C are sectional views of processes to help explain a method of repairing faulty cell blocks.

FIG. 15A shows an element structure in the stage where a cathode electrode 13 acting as a main electrode of a first layer and a control electrode 11 are formed by a known method. The element structure is as follows.

In the figure, numeral 1 indicates a high-resistance n-type base layer. On the bottom surface of the n-type base layer 1, a low-resistance p-type emitter layer 5 is formed. At the top surface of the n-type base layer 1, a p-type base layer 2 is selectively formed. At the top surface of the p-type base layer 2, an n-type emitter layer 3 and a high-concentration p-type diffusion layer 12 are selectively formed.

Above the top surface of the p-type base layer 2 sandwiched between the n-type base layer 1 and the n-type emitter layer 3, a gate electrode 8 is provided via a gate insulating film 7. The n-type emitter layer 3 is provided with a cathode electrode 13 and the p-type diffusion layer 12 is provided with a control electrode 11. An insulating film 10 electrically separates the gate electrode 8 from the cathode electrode 13.

In the stage where such an element structure has been formed, short-circuit measurements are made, for example, between gate electrode 8 and cathode electrode 13, between control electrode 11 and cathode electrode 13, and between gate electrode 8 and control electrode 11 to determine whether a fault has occurred. Instead of the short-circuit measurement, fault judgment may be made on the basis of variations in the turn-off capability.

Figure 17:
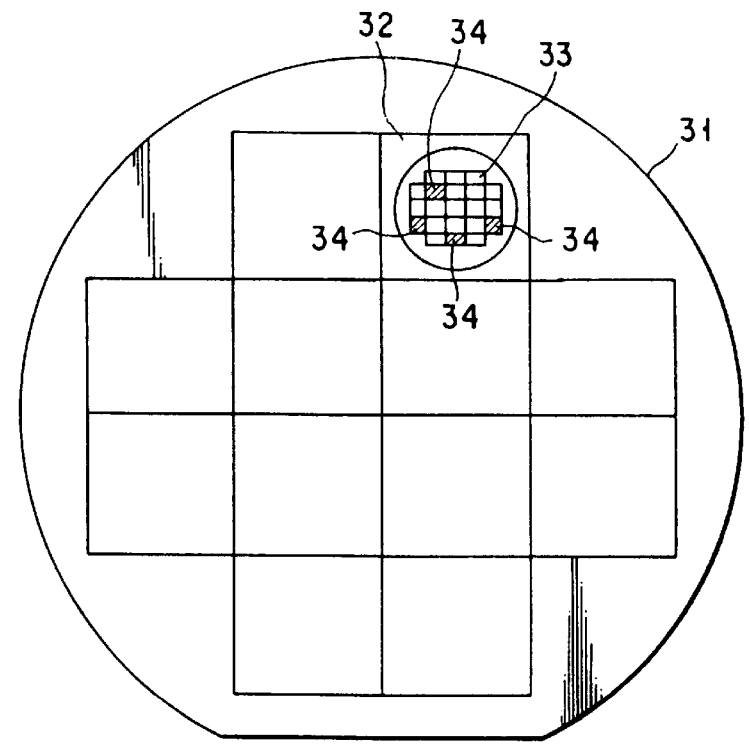
FIG. 17 illustrates mapping data on the faulty portions.

Fault judgment may be made in cell units or in cell blocks. By making fault judgment for all the cell blocks 33 in the power semiconductor device 32, the mapping data about faulty portions in the cell blocks is created as shown in FIG. 17. Such mapping data is created for the other power semiconductor devices 32.

As shown in FIG. 15B, after a negative insulating film 14 (e.g., a polyimide film) functioning as a negative resist has been formed on the entire surface, light 36a is projected on the negative insulating film 14 through a mask pattern 37a as usual. Specifically, light 36a is selectively projected on the portion of the insulating film 14 above the control electrode 11 for exposure.

The normal exposure is carried out by the system shown in FIG. 1, which takes a shot of the power semiconductor devices 32 one by one. As a result, of the power semiconductor devices 32, both those having good cell blocks 33 and those having faulty cell blocks 34 are subjected to the exposure process.

After this, each power semiconductor device 32 undergoes the following manufacturing process.

The stepper exposure apparatus is programmed using the mapping data. By using the programmed repair system, only the faulty cell blocks 34 are selectively exposed one by one on their whole surface as shown in FIG. 16. Such selective exposure for repair is performed for each power semiconductor device 32 in sequence.

Then, as shown in FIGS. 15C and 16B, the negative insulating film 14 is developed. Specifically, in the negative insulating film 14 of the good cell block, the portions above the gate electrode 8 and the cathode electrode 13 are removed, whereas the negative insulating film 14 of the faulty cell block 34 is not patterned and remains as it was.

Next, as shown in FIGS. 15D and 16C, the cathode electrode layer 15 is formed on the entire surface. At this time, since the negative insulating film 14 of the faulty cell block 34 has not been patterned as noted above, this produces a structure where only the cathode electrode 13 of the first layer in the good cell block is in contact with the cathode electrode layer 15 of the second layer.

In this way, the repair process is completed by isolating the cathode electrode layer 15 of the second layer in the faulty cell block 34 from the cathode electrode 13 in the faulty portion.

The cathode electrode layer 15 of the second layer on the faulty portion may be removed by using the mapping data again.

As described above, with the embodiment, since a cell block is used as a repair unit, use of a repair system for a stepper exposure apparatus enables only the main electrodes of the faulty cell blocks to be selectively electrically separated from the main electrodes of the good cell blocks. Therefore, it is possible to repair faulty portions efficiently with a machine, and consequently prevent a drop in the repairing work efficiency due to the tendency toward much finer power semiconductor elements.

While in the embodiment, repair is made after the first main electrode has been formed, it may be made in another process stage.

Although in the embodiment, the case where a negative insulating film is used has been explained, when a positive insulating film is used, for example, only the good cell blocks have only to be selectively exposed using a good pattern, leaving the faulty cell blocks without exposure. Alternatively, after a positive insulating film has been exposed as usual, thereby patterning the positive insulating film above all the main electrodes, a negative insulating film may be applied, and then only the faulty cell blocks may be exposed on their whole surface, thereby removing the negative insulating film above the main electrodes of the good cell blocks.

Figure 18:
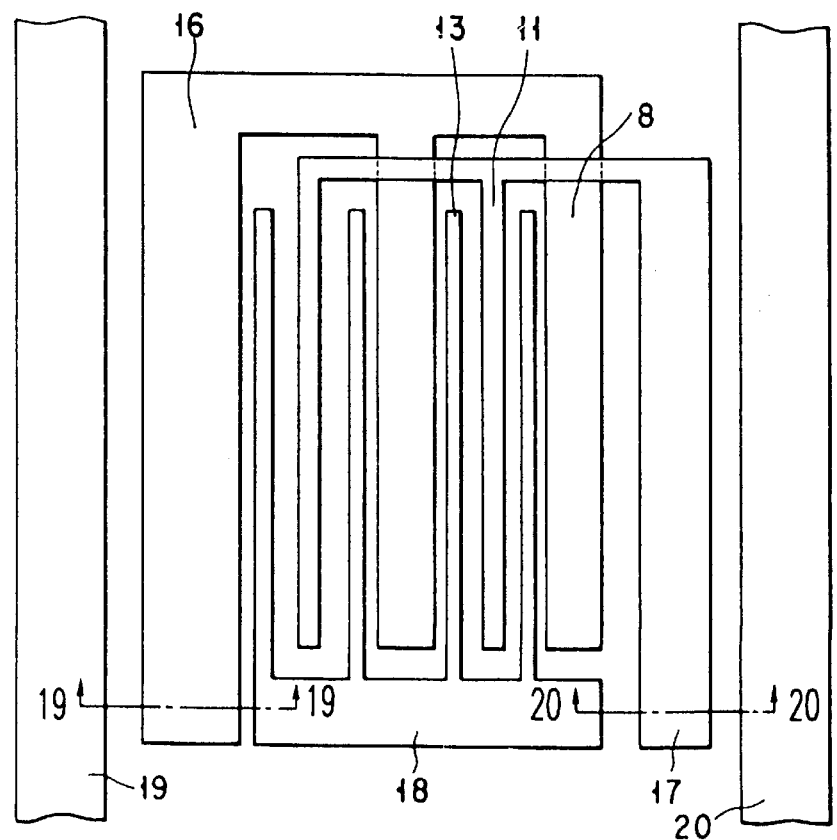
FIG. 18 is a plan view of a modification of the seventh embodiment.

For more accurate repair, for example, a cell block gate pad 16, a cell block control pad 17, and a cell block cathode pad 18 may be provided separately in each cell block, as shown in the plan view of FIG. 18 in the stage where the main electrode of the first layer is formed.

With those pads 16, 17, and 18, a normal electrical connection can be achieved for the good cell blocks by connecting the cell block gate pad 16 to a gate bus line (the common gate line also connected to the gate of another turn-off thyristor with an insulated gate) 19, the cell block control pad 17 to a control bus line (the common control line also connected to another control electrode) 20, and the cell block cathode pad 18 to the cathode electrode of the second layer, after the cathode electrode layer of the second layer has been formed.

On the other hand, for the faulty cell blocks, both the cell block gate pad 16 and the cell block control pad 17 are connected to the cell block cathode pad 18 by effecting a selective lithography using a mask pattern for faulty cell blocks, as shown in FIG. 18. FIG. 19 is a sectional view taken along line 19—19 of FIG. 18 after the cathode electrode layer 15 of the second layer has been formed, and FIG. 20 is a sectional view taken along line 20—20 of FIG. 18. As a result, the pads 16 and 17 are prevented from electrically connecting with the bus lines 19 and 20 via other power semiconductor elements, thereby assuring reliable repair.

(Eighth embodiment)

Hereinafter, a exposure method according to an eighth embodiment of the present invention will be explained.

FIGS. 21A to 21C are sectional views of processes to help explain a method of repairing bipolar transistors with insulated gates (IGBTs). The gate electrode 8 is assumed to be independent for each cell block.

First, as shown in FIG. 21A, after those portions up to a source electrode 22 acting as a main electrode have been formed, fault measurement is made to determine faulty cell blocks.

Then, as shown in FIG. 21B, after a positive resist 23 has been applied to the entire surface, the positive resist 23 above the faulty cell blocks 34 is selectively exposed on the whole surface.

After this, the positive resist 23 is developed to form a resist pattern. With the resist pattern as a mask, the source electrode 22 of the faulty cell block 34 is selectively etched away.

Then, as shown in FIG. 21C, an insulating film 27 is deposited on the entire surface. As a result, only the portion where the source electrode 22 of the faulty cell block 34 exists is electrically separated by an insulating film 27 from the source electrodes 22 of the good cell blocks.

Thereafter, the gate electrodes of the good cell blocks are connected to each other by bonding to complete the chip.

With the independent source electrode 22 for each cell block, the gate electrode 8 can be short-circuited with the source electrode 22 in the faulty cell block, thereby making it independent of the other elements.

The present invention is not limited to the above embodiments. For instance, while in the first and second embodiments, Schottky diodes and IGBTs are used as semiconductor elements, the present invention may be applied to other power semiconductor elements such as GTOs or MOS thyristors.

Additionally, while in the seventh and eighth embodiments, a stepper exposure apparatus has been used as a repair system, a direct drawing exposure apparatus can be used instead.

Furthermore, for instance, by connecting an automatic fault measuring apparatus (e.g., an autoprober), an insulating film coater, and an exposure apparatus through an automatic transport system, and automatically transferring the measurement data from the automatic fault measuring apparatus to the exposure apparatus, the work efficiency can be improved remarkably.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

We claim:

1. A method of manufacturing a power semiconductor device having an area of 3 cm$^2$ or more and including a plurality of semiconductor elements, having fine patterns whose minimum linewidth is less than 10 $\mu$m, said method comprising:

forming said fine patterns by a step including step exposure;

forming a non-fine pattern of said power semiconductor device by a step including 1:1 entire surface exposure; and forming an alignment mark in an active area of said power semiconductor device, said alignment mark being used in said step exposure and said 1:1 entire surface exposure.

2. A method according to claim 1, wherein said fine patterns are pattens having said minimum linewidth of 5 $\mu$m or more less.

3. A method according to claim 1, wherein said power semiconductor device has said area of 20 cm$^2$ or more.

4. A method of manufacturing power semiconductor device according to claim 1, wherein said plurality of semiconductor elements are a plurality of power semiconductor elements.

5. A method of manufacturing power semiconductor device according to claim 1, wherein said plurality of semiconductor elements include a plurality of power semiconductor elements and a plurality of control semiconductor elements.

6. A method of manufacturing power semiconductor device according to claim 1, wherein the fine patterns of said power semiconductor device are a plurality of different fine patterns.

7. A method of manufacturing power semiconductor device according to claim 1, wherein said plurality of semiconductor elements are a plurality of same power semiconductor elements.

8. A method of manufacturing power semiconductor device according to claim 1, wherein the fine patterns of said power semiconductor device are formed by repeating the step including the step exposure.

9. A method of manufacturing power semiconductor device according to claim 1, wherein said fine patterns include fine patterns in a junction termination area, an electrode pad area, an element separation area and dicing area.

10. A method according to claim 1, wherein said alignment mark used in said step exposure is covered with an insulating film by steps including said 1:1 entire surface exposure.

11. A method of manufacturing power semiconductor device, having an area of 3 cm$^2$ or more, and including a plurality of semiconductor elements consisting of different semiconductor elements having the same fine patterns whose minimum linewidth is less than 10 $\mu$m, comprising:

forming said fine patterns by a step including step exposure;

forming a non-fine pattern of said power semiconductor device by a step including 1:1 entire surface exposure; and forming an alignment mark, in an active area of said power semiconductor device, said alignment mark being used in said step exposure and said 1:1 entire surface exposure.

12. A method of manufacturing a power semiconductor device having an area of 3 cm$^2$ or more and including a plurality of cell blocks having main electrodes and power semiconductor elements formed in said cell block, said power semiconductor elements having a fine pattern whose minimum linewidth is less that 10 $\mu$m, said method comprising:

forming said fine pattern by a step including step exposure and forming a non-fine pattern of said power semiconductor device by a step including 1:1 entire surface exposure;

determining cell blocks having faulty portions;

forming an alignment mark in an active area of said power semiconductor device, said alignment mark being used in said step exposure and said 1:1 entire surface exposure; and forming interconnection lines by the step including the step exposure so that main electrodes in cell blocks determined to have faulty portions may be selectively electrically separated from main electrodes in cell blocks not determined to have faculty portions.

13. A method of manufacturing power semiconductor device according to claim 12, wherein said fine pattern forming step includes the step of repeating the step exposure for each of said cell blocks.

14. A method of manufacturing power semiconductor device according to claim 12, further comprising:

covering at least one alignment mark used in said step exposure with an insulating film by the step including the 1:1 entire surface exposure.

15. A method of manufacturing power semiconductor device according to claim 12, wherein the step of determining said cell blocks having faulty portions comprises performing a short-circuit measurement to determine said cell block having faulty portions.

16. A method of manufacturing power semiconductor devices according to claim 12, wherein the step of determining said cell blocks having faulty portions determines said faulty portions with use of a dispersion of element's characteristics.

17. A method of manufacturing power semiconductor device according to claim 12, wherein said interconnection line forming step comprises:

forming a negative light-sensitive insulating film on an area including said cell blocks, selectively making opening portions, by the step including the step exposure, in said negative light-sensitive insulating film above the main electrodes in said cell blocks not determined to have faulty portions, and forming a conducting film on the area including said cell blocks and patterning said conducting film to form said interconnection lines.

18. A method of manufacturing power semiconductor device according to claim 12, wherein said interconnection line forming step selectively electrically separates the main electrodes in said cell blocks having faulty portions from the main electrodes in said cell blocks having no faulty portions by selectively electrically separating said cell blocks having faulty portions from said cell blocks having no faulty portions.

* * * * *